United States Patent
Torimoto et al.

(10) Patent No.: US 10,081,764 B2
(45) Date of Patent: Sep. 25, 2018

(54) TELLURIUM COMPOUND NANOPARTICLES, COMPOSITE NANOPARTICLES, AND PRODUCTION METHODS THEREFOR

(71) Applicants: NATIONAL UNIVERSITY CORPORATION NAGOYA UNIVERSITY, Nagoya-shi, Aichi-ken (JP); NICHIA CORPORATION, Anan-shi, Tokushima (JP)

(72) Inventors: Tsukasa Torimoto, Nagoya (JP); Tatsuya Kameyama, Nagoya (JP); Yujiro Ishigami, Nagoya (JP); Kouta Sugiura, Nagoya (JP); Daisuke Oyamatsu, Tokushima (JP)

(73) Assignees: NATIONAL UNIVERSITY CORPORATION NAGOYA UNIVERSITY, Nagoya-shi (JP); NICHIA CORPORATION, Anan-shi (JP)

( * ) Notice: Subject to any disclaimer, the term of this patent is extended or adjusted under 35 U.S.C. 154(b) by 144 days.

(21) Appl. No.: 15/200,528

(22) Filed: Jul. 1, 2016

(65) Prior Publication Data
US 2017/0002265 A1    Jan. 5, 2017

(30) Foreign Application Priority Data

Jul. 3, 2015   (JP) ................................. 2015-134488
Dec. 16, 2015  (JP) ................................. 2015-245150

(51) Int. Cl.
| | |
|---|---|
| C09K 11/08 | (2006.01) |
| C09K 11/62 | (2006.01) |
| C09K 11/58 | (2006.01) |
| C09K 11/56 | (2006.01) |
| C09K 11/88 | (2006.01) |
| C01B 19/00 | (2006.01) |
| H01L 33/50 | (2010.01) |
| C01G 15/00 | (2006.01) |
| B82Y 40/00 | (2011.01) |
| B82Y 20/00 | (2011.01) |
| B82Y 30/00 | (2011.01) |

(52) U.S. Cl.
CPC .......... *C09K 11/881* (2013.01); *C01B 19/007* (2013.01); *C01G 15/006* (2013.01); *H01L 33/502* (2013.01); *B82Y 20/00* (2013.01); *B82Y 30/00* (2013.01); *B82Y 40/00* (2013.01); *C01P 2002/72* (2013.01); *C01P 2002/76* (2013.01); *C01P 2002/77* (2013.01); *C01P 2004/04* (2013.01); *C01P 2004/16* (2013.01); *C01P 2004/64* (2013.01); *C01P 2004/80* (2013.01); *Y10S 977/762* (2013.01); *Y10S 977/896* (2013.01); *Y10S 977/95* (2013.01)

(58) Field of Classification Search
CPC ... C09K 11/881; C01B 19/007; C01B 15/006; H01L 33/502; B82Y 20/00; B82Y 40/00; Y10S 977/774; Y10S 977/95; C01P 2004/16; C01P 2004/64; C01P 2004/84
See application file for complete search history.

(56) References Cited

U.S. PATENT DOCUMENTS

| | | | | |
|---|---|---|---|---|
| 7,986,088 B2* | 7/2011 | Sekiya | ................. | C09K 11/025 313/501 |
| 2008/0277625 A1* | 11/2008 | Nakamura | ........... | C09K 11/582 252/301.4 S |
| 2010/0193806 A1 | 8/2010 | Byun | | |

FOREIGN PATENT DOCUMENTS

| | | |
|---|---|---|
| JP | 2010-106119 A | 5/2010 |
| JP | 2010-177656 A | 8/2010 |
| JP | 2012-212862 A | 11/2012 |
| WO | 2006-009124 A1 | 1/2006 |
| WO | 2014-129067 A1 | 8/2014 |

OTHER PUBLICATIONS

Torimoto et al., "Remarkable photoluminescence enhancement of AnS-AgInS2 solid solution nanoparticles by post-synthesis treatment." Chem. Commun., 2010, vol. 46, pp. 2082-2084.

* cited by examiner

*Primary Examiner* — C Melissa Koslow
(74) *Attorney, Agent, or Firm* — Hunton Andrews Kurth LLP

(57) ABSTRACT

Tellurium compound nanoparticles, including: an element $M^1$ where $M^1$ is at least one element selected from Cu, Ag, and Au; an element $M^2$ where $M^2$ is at least one element selected from B, Al, Ga, and In; Te; and optionally an element $M^3$ where $M^3$ is at least one element selected from Zn, Cd, and Hg; wherein a crystal structure of the tellurium compound nanoparticles is a hexagonal system, the tellurium compound nanoparticles are of a rod shape and have an average short-axis length of 5.5 nm or less, and when irradiated with light at a wavelength in a range of 350 nm to 1,000 nm, the tellurium compound nanoparticles emit photoluminescence having a wavelength longer than the wavelength of the irradiation light.

23 Claims, 3 Drawing Sheets

TELLURIUM COMPOUND NANOPARTICLES, COMPOSITE NANOPARTICLES, AND PRODUCTION METHODS THEREFOR

CROSS REFERENCE TO RELATED APPLICATIONS

This application claims the priority of Japanese Patent Application No. 2015-134488 filed on Jul. 3, 2015 and Japanese Patent Application No. 2015-245150 filed on Dec. 16, 2015, the disclosure of which, including the specifications, drawings, and claims, are incorporated herein by reference in their entireties.

BACKGROUND OF THE INVENTION

Field of the Invention

The present disclosure relates to tellurium compound nanoparticles, composite nanoparticles, producing methods therefor, and a light-emitting device and a liquid crystal display device using the tellurium compound nanoparticles.

Description of the Related Art

There are proposed white light-emitting devices for use in backlights of liquid crystal display devices and the like that utilize photoluminescence emission from quantum dots (also called "semiconductor quantum dots"). Fine particles of the semiconductor having a particle size of e.g., 10 nm or less are known to exhibit a quantum size effect, and such nanoparticles are called quantum dots. The quantum size effect is a phenomenon where a valence band and a conduction band, each of which is regarded as continuous in bulk particles, become discrete when the particle size is on the nanoscale, whereby a bandgap energy changes depending on their particle size.

The quantum dots absorb light and emit light corresponding to the bandgap energy. Thus, the quantum dots can be used as a wavelength conversion material in the light-emitting devices. For example, Japanese Unexamined Patent Application Publication No. 2012-212862 and Japanese Unexamined Patent Application Publication No. 2010-177656 have proposed the light-emitting devices using the quantum dots. Specifically, part of the light emitted from a LED chip is absorbed by the quantum dots, which emit light of another color. The light emitted from the quantum dots and the light from the LED chip not absorbed by the quantum dots are mixed to produce white light. These patent documents have suggested the use of quantum dots made of group II-VI compounds, such as CdSe and CdTe, or group IV-VI compounds, such as PbS and PbSe. WO 2014/129067 has proposed a wavelength conversion film utilizing core-shell semiconductor quantum dots that are designed not to contain Cd or Pd, taking into consideration the toxicity of compounds containing these elements. The formation of such a core-shell structure is also mentioned in Non-patent document Chem, Commun. 2010, vol. 46, pp. 2082-2084.

One of the advantages in the use of the quantum dots in the light-emitting devices is that the light with a wavelength corresponding to a bandgap can have a peak with a relatively narrow full width at half maximum. However, among the quantum dots proposed as the wavelength conversion material, only quantum dots made of a binary semiconductor, typified by a group II-VI semiconductor, such as CdSe, can be confirmed to emit the light with the wavelength corresponding to the bandgap, that is, to achieve band-edge emission. Meanwhile, ternary quantum dots, especially, group quantum dots have not been confirmed to exhibit the band-edge emission.

The light emitted from the group quantum dots is caused by the defect levels of the surface or inside of the particles, or by the donor-acceptor-pair recombination, and thus has a broad emission peak with a wide full width at half maximum and a long photoluminescence lifetime. Such light emission is not appropriate for light-emitting devices, particularly, used in the liquid crystal display device. This is because the light-emitting device used in the liquid crystal display device is required to emit light with a narrow full width at half maximum that has a peak wavelength corresponding to each of three primary colors (i.e., RGB) in order to ensure the high color reproducibility. For this reason, practical use of the ternary quantum dots have not been promoted despite its less toxic composition.

SUMMARY OF THE INVENTION

Therefore, it is an object of an embodiment of the present disclosure to provide tellurium compound nanoparticles as ternary (or quaternary) quantum dots that can achieve the band-edge emission with a less toxic composition.

Tellurium compound nanoparticles include: an element $M^1$ where $M^1$ is at least one element selected from Cu, Ag, and Au; an element $M^2$ where $M^2$ is at least one element selected from B, Al, Ga, and In; Te; and optionally an element $M^3$ where $M^3$ is at least one element selected from Zn, Cd, and Hg; wherein a crystal structure of the tellurium compound nanoparticles is a hexagonal system, the tellurium compound nanoparticles are of a rod shape and have an average short-axis length of 5.5 nm or less, and when irradiated with light at a wavelength in a range of 350 nm to 1,000 nm, the tellurium compound nanoparticles emit photoluminescence having a wavelength longer than the wavelength of the irradiation light.

The above-mentioned tellurium compound nanoparticles produce the band-edge emission owing to their shape and size, which cannot be obtained by conventional ternary quantum dots. Furthermore, the above tellurium compound nanoparticles can have a composition that does not contain highly toxic elements, such as Cd and Pb, and can be applied to products in which the use of Cd and the like is prohibited. Therefore, the tellurium compound nanoparticles can be suitable for use as a wavelength conversion material of the light-emitting device used in the liquid crystal display device or as a biomolecule marker.

DETAILED DESCRIPTION OF THE INVENTION

Figure 1:
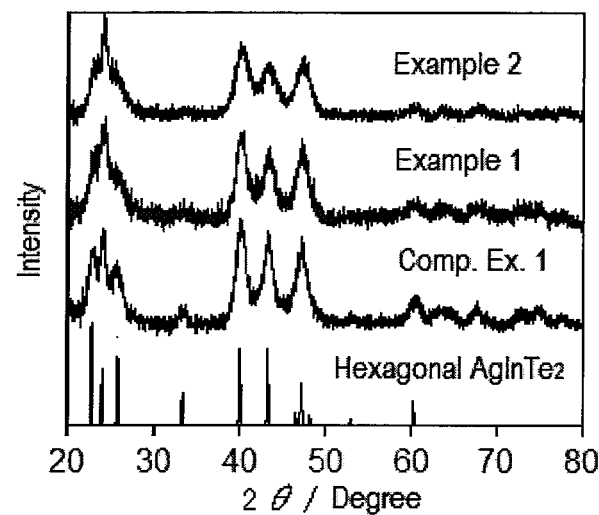
FIG. 1 shows X-ray diffraction (XRD) patterns of tellurium compound nanoparticles synthesized in Examples 1 and 2 and Comparative Example 1.

Embodiments of the present disclosure will be described in detail below. Note that the present disclosure is not intended to be limited by the following embodiments. Matters mentioned in the respective embodiments and their modified examples can be applied to other embodiments and modified examples unless otherwise specified.

(Tellurium Compound Nanoparticles)

Description will be made for, as a first embodiment, tellurium compound nanoparticles represented by the general formula:

$$(M^1M^2)_xM^3{}_yTe_2$$

where $M^1$ is at least one element selected from Cu, Ag, and Au, preferably Ag or Cu, and particularly preferably Ag. When $M^1$ is Ag, the tellurium compound nanoparticles can be easily synthesized. Two or more elements may be contained as $M^1$.

$M^2$ is at least one element selected from B, Al, Ga, and In, preferably In or Ga, and particularly preferably In. The In element is preferable because it is less likely to generate a by-product. Two or more elements may be contained as $M^2$.

$M^3$ is at least one element selected from Zn, Cd, and Hg, and preferably Zn. When $M^3$ is Zn, the tellurium compound nanoparticles with a less toxic composition can be produced. Two or more elements may be contained as $M^3$.

The combinations of $M^1$ and $M^2$ are not specifically limited. The combinations of $M^1$ and $M^2$ (typical notation is: "$M^1/M^2$") preferably include Cu/In and Ag/In. The combinations of $M^1$, $M^2$, and $M^3$ are not also specifically limited. The combinations of $M^1$, $M^2$, and $M^3$ (typical notation is: $M^1/M^2/M^3$) preferably include Cu/In/Zn and Ag/In/Zn.

In the general formula: $(M^1M^2)_xM^3{}_yTe_2$, x and y satisfy the following relationship: x+y=2, 0≤y<2. By selecting a y value as appropriate, a bandgap energy can be changed, or an emission intensity can be changed. For example, y may be selected from a range of 0≤y<2, particularly 0≤y≤1.5, and more particularly 0≤y≤1.2.

In the above general formula, part of $M^2$ may be substituted by other metal elements. Other metal elements can be those which form trivalent metal ions, specifically, one or more elements selected from Cr, Fe, Al, Y, Sc, La, V, Mn, Co, Ni, Ga, In, Rh, Ru, Mo, Nb, W, Bi, As, and Sb. The substitution rate of the substitution element is preferably 10% or less when the total number of atoms contained in $M^2$ and the substitution element is set to 100%.

In the above general formula, part of $M^3$ may be substituted by other metal elements. Other metal elements can be those which form divalent metal ions, specifically, one or more elements selected from Co, Ni, Pd, Sr, Ba, Fe, Cr, Mn, Cu, Cd, Rh, W, Ru, Pb, Sn, Mg, and Ca. The substitution rate of the substitution element is preferably 10% or less when the total number of atoms contained in $M^3$ and the substitution element is set to 100%.

In the general formula, part of Te may be substituted by at least one element selected from S and Se. The substitution rate of the substitution element is preferably 50% or less when the total number of atoms contained in Te and the substitution element is set to 100%.

The chemical composition of the tellurium compound nanoparticles can be identified, for example, by energy dispersive X-ray analysis (EDX) or fluorescent X-ray analysis (XRF). When analyzing the chemical composition of tellurium compound nanoparticles, the tellurium compound nanoparticles shall be represented by the above general formula, if $M^1$, $M^2$, and $M^3$ are elements defined above, and further, x+y is determined to be 2, which is written to one significant figure, by using a ratio of Te (i.e., 2) as the reference, or alternatively if a ratio of Te is determined to be 2, which is written to one significant figure, by using a value of x+y as the reference (i.e., x+y as 2). Each of x and y, which is less than 1, is written to one significant figure, while each of x and y, which is equal to or more than 1, is written to two significant figures. In the general formula: $(M^1M^2)_xM^3{}_yTe_2$, the notation "$(M^1M^2)$" means it contains $M^1$ and $M^2$ at an arbitrary ratio. Nevertheless, in general, the ratio between M1 and M2 is generally 1:1 as the stoichiometric composition.

Otherwise, when representing tellurium compound nanoparticles containing the elements $M^1$, $M^2$, $M^3$, and Te by general formula: $(M^1M^2)_xM^3{}_yTe_2$, the ratio of Te might not possibly be determined to be 2 by using x+y as the reference (that is, with (x+y) set to 2) in some cases, and thus the tellurium compound nanoparticles cannot be represented by this general formula: $(M^1M^2)_xM^3{}_yTe_2$ (x+y=2). Even such a tellurium compound may be included in the tellurium compound nanoparticles of this embodiment if such a tellurium compound satisfies the following conditions: the compound nanoparticles are a hexagonal crystal structure; the nanoparticles are mostly in a rod-shaped, and have an average short-axis length is 5.5 nm or less, as will be mentioned later; and when being irradiated with the light at a wavelength of 350 nm to 1,000 nm, this tellurium compound emits photoluminescence at a longer wavelength than the irradiation light. In the present specification, the term "photoluminescence" includes fluorescence.

Specifically, even if the respective amounts of a salt of $M^1$ (i.e., $M^1$ salt), a salt of $M^2$ (i.e., $M^2$ salt), a salt of $M^3$ (i.e., $M^3$ salt), and a Te-phosphine complex are selected to achieve the ratios thereof in the tellurium compound with the stoichiometric composition in producing the tellurium compound nanoparticles by the following method, the thus-obtained tellurium compound does not always have the stoichiometric composition. For example, the thus-obtained tellurium compound tends to contain $M^2$ at a larger ratio than the theoretical value of $M^2$ (atomic %). The theoretical value of $M^2$ means the ratio of $M^2$ to the total of $M^1$, $M^2$, $M^3$, and Te in terms of the number of atoms, in the tellurium compound with the stoichiometric composition represented by general formula: $(M^1M^2)_xM^3{}_yTe_2$. On the other hand, this tellurium compound tends to contain $M^1$ at a smaller ratio than its theoretical value.

The crystal structure of the tellurium compound particles according to this embodiment is a hexagonal crystal structure. The hexagonal tellurium compound nanoparticles tend to have the rod shape. The hexagonal crystal structure is of a wurtzite type, and a tetragonal crystal structure is of a chalcopyrite type.

The tellurium compound nanoparticles of this embodiment have the rod shape and an average short-axis length of 5.5 nm or less. The tellurium compound nanoparticles with such shape and size can produce the so-called band-edge emission. When the average short-axis length of the nanoparticles exceeds 5.5 nm, the band-edge emission is less likely to be obtained. The average short-axis length may be equal to or less than 3 nm. Preferably, in the aggregate of the tellurium compound nanoparticles, the short axis of each of the tellurium compound nanoparticles is 5.5 nm or less.

Here, the "rod-shaped" nanoparticles are observed to have a quadrangular shape including a rectangular shape (its cross section having the shape of a circle, an oval, or a polygon), an ellipsoidal shape, a polygonal shape (for example, a pen-like shape), or the like on their transmission electron microscope (TEM) images taken by the use of a TEM. The term "rod shape" as used herein is defined as the shape having a ratio of the long axis to the short axis of more than 1.2, the shape being observed and determined by a TEM image. Here, for the ellipsoidal shape, the length of the long axis indicates the longest one of line segments each formed by connecting any two points on the outer periphery of a single particle. On the other hand, for the quadrangular or polygonal shape, the length of the long axis indicates the longest one of line segments that are in parallel with the longest side out of all sides forming the outer periphery of the shape and formed by connecting any two points on the outer periphery of a single particle. The length of the short axis indicates the longest one out of line segments each formed by connecting any two points on the outer periphery of a single particle and positioned perpendicular to the line segment defining the long axis.

The average short-axis length is an arithmetic average of the short-axis lengths determined by taking TEM images at a magnification of 50,000× to 150,000× and measuring and averaging the lengths of the short axes of all the measurable rod-shaped nanoparticles observed on the TEM images. Here, the "measurable" particle indicates a particle, the whole of which can be observed on the TEM image. Thus, on the TEM image, a particle missing its part in an image range, such as a particle of which part is "cut," is not "measureable" one.

When one TEM image contains 100 or more rod-shaped nanoparticles in total, the average short-axis length of the nanoparticles is determined by using this TEM image. When one TEM image contains a smaller number of nanoparticles, more TEM images are taken by changing sites for imaging, and 100 or more nanoparticles in total contained in two or more TEM images are then observed to measure the lengths of the short axes of the nanoparticles.

In the tellurium compound nanoparticles of this embodiment, a ratio (A) of an average long-axis length of the particles to the average short-axis length thereof is, for example, in a range of 1.2<A≤20, particularly, 1.5≤A≤20, and more particularly 2≤A≤5. The tellurium compound nanoparticles with such a ratio of the average long-axis length to the average short-axis length easily produce the band-edge emission. As the case of determining the average short-axis length, the average long-axis length is an arithmetic average of the long-axis lengths of 100 or more nanoparticles in total observed on the TEM image(s).

The tellurium compound nanoparticles of this embodiment enable the band-edge emission mainly owing to their shapes and sizes. Specifically, when irradiated with light in a wavelength range of 350 nm to 1,000 nm, the tellurium compound nanoparticles of this embodiment can emit photoluminescence having a wavelength longer than that of the irradiation light. The photoluminescence preferably has a photoluminescence lifetime of the component having the highest contribution rate is 150 ns or less. The light emitted from the tellurium compound nanoparticles of this embodiment is preferably observed to have a full width at half maximum of 150 nm or less in an emission spectrum of the tellurium compound nanoparticles. The reason why the tellurium compound nanoparticles of this embodiment can produce the band-edge emission is uncertain, but it can be presumed that a defect level is reduced by forming the nanoparticles into an elongated rod shape and setting the average short-axis length thereof at 5.5 nm or less and thereby the defective light emission is eliminated or reduced.

The above-mentioned value "photoluminescence lifetime of the component having the highest contribution rate" is determined in the following way. First, the tellurium compound nanoparticles are irradiated with an excitation light to thereby emit photoluminescence therefrom. Regarding the photoluminescence with a wavelength in a range of wavelengths around the peak wavelength (hereinafter referred to as a "lifetime-measurement photoluminescence"), for example, peak wavelength ±50 nm of the emission spectrum, the change in attenuation of the photoluminescence (i.e., afterglow) is measured over time. The measurement of the change over time starts from the time when irradiation with the excitation light is stopped. A decay curve obtained is a resultant of adding a plurality of decay curves resulting from relaxation processes, such as light emission and heat. Thus, in this embodiment, on the assumption that the obtained decay curve contains three components (i.e., three decay curves), parameter fitting is performed such that the decay curve is represented by the following formula where I (t) is a photoluminescence intensity. The parameter fitting is performed using a dedicated software (e.g., DAS6 manufactured by HORIBA, Ltd).

$$I(t)=A_1\exp(-t/\tau_1)+A_2\exp(-t/\tau_2)+A_3\exp(-t/\tau_3)$$

In the above formula, $\tau_1$, $\tau_2$, and $\tau_3$ of these respective components mean the times required for attenuating the light intensities to 1/e (36.8%) of the respective initial levels, and those times correspond to the photoluminescence lifetimes of the respective components. The times $\tau_1$, $\tau_2$, and $\tau_3$ are named in the order of increasing the photoluminescence lifetime. $A_1$, $A_2$, and $A_3$ are contribution rates of the respective components. In this embodiment, the photoluminescence in which the photoluminescence lifetime $\tau$ of the component having the highest contribution rate is 150 ns or less can be obtained. Such photoluminescence is supposed to be the band-edge emission.

In this embodiment, the decay curves obtained by performing the parameter fitting assuming that the photoluminescence decay curve contains three, four, or five components, respectively, do not differ from each other so much in terms of the deviation from an actual decay curve. For this reason, the photoluminescence lifetime of the component having the highest contribution rate is determined in this embodiment on the assumption that the number of components included in the photoluminescence decay curve is three, thereby avoiding the complexity of the parameter fitting.

Figure 2:
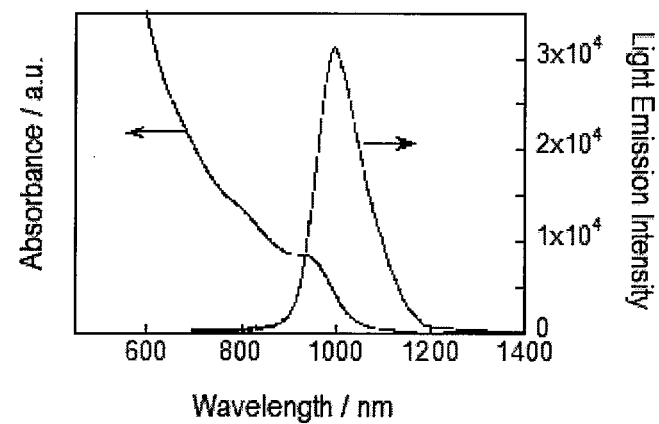
FIG. 2 shows an absorption spectrum and an emission spectrum of the tellurium compound nanoparticles synthesized in Example 1.

The emission spectrum of the tellurium compound nanoparticles is obtained when irradiating the nanoparticles with light having a wavelength selected from a range of 350 nm to 1100 nm. For example, for the tellurium compound nanoparticles represented by $AgInTe_2$, when irradiated with the light at a wavelength of 700 nm, the nanoparticles can produce the emission spectrum in which an emission peak is observed at about 1100 nm as shown in FIG. 2.

The band-edge emission from the tellurium compound nanoparticles can change its peak position by adjusting the shape and/or size, especially the size of the tellurium compound nanoparticles. For example, by decreasing the average short-axis length of the tellurium compound nanoparticles, the bandgap energy becomes larger by the quantum size effect, so that the peak wavelength of the band-edge emission can be shifted toward a shorter wavelength.

The absorption spectrum of the tellurium compound nanoparticles is obtained when irradiated with light of wavelengths selected from a range of 250 nm to 1400 nm. For example, for the tellurium compound nanoparticles represented by AgInTe$_2$, when they are irradiated with the light of wavelengths in a range of 450 nm to 1400 nm, the absorption spectrum as shown in FIG. 2 can be obtained.

The tellurium compound nanoparticles of this embodiment preferably give the absorption spectrum exhibiting an exciton peak. The exciton peak is a peak obtained by formation of an exciton. The exhibition of this peak in the absorption spectrum means that the tellurium compound nanoparticles have the small distribution of short-axis lengths and few crystal defects, being appropriate for the band-edge emission. It also means that as the exciton peak becomes sharper, the aggregate of semiconductor nanoparticles contains a greater amount of particles having uniform short-axis length with less crystal defects, and hence the full width at half maximum of the light emission from the nanoparticles becomes narrower, thereby improving the luminous efficiency. In the absorption spectrum of the tellurium compound nanoparticles of this embodiment, the exciton peak is observed, for example, in a range of 350 nm to 1,000 nm.

The tellurium compound nanoparticles having the composition, shape, size, emission properties, and absorption properties mentioned above may have their surfaces modified by any compound. Generally, a compound that modifies surfaces of nanoparticles is called a "surface modifier". The surface modifier is used, for example, to prevent agglomeration and further growth of the nanoparticles by stabilizing the nanoparticles, and/or to improve the dispersibility of the nanoparticles in a corresponding solvent.

In this embodiment, the surface modifier is preferably hydrocarbon-based thiol. The use of the hydrocarbon-based thiol improves dispersion stability of the particles in an organic solvent. The hydrocarbon moiety of the hydrocarbon-based thiol preferably has 4 to 20 carbon atoms. Examples of the hydrocarbon moiety can include optionally branched saturated aliphatic hydrocarbons such as n-butane, isobutane, n-pentane, n-octane, n-decane, n-dodecane, n-hexadecane, and n-octadecane; alicyclic hydrocarbons such as a cyclopentane and a cyclohexane; and aromatic hydrocarbons such as benzene and naphthalene. Among them, the saturated aliphatic hydrocarbon is preferable. The hydrocarbon-based thiol is considered to be coordinately bonded to the surface of the tellurium compound nanoparticles via sulfur.

(Tellurium Compound Composite Nanoparticles)

As a second embodiment, a description will be given of tellurium compound composite nanoparticles wherein the tellurium compound nanoparticles of the first embodiment are covered with a coating layer. The tellurium compound composite nanoparticles have the structure that includes one or more coating layers provided on a surface of the tellurium compound nanoparticles of the first embodiment, the coating layer being made of material represented by general formula: C'Z' (where C' is at least one element selected from the group consisting of Zn and Cd, and Z' is at least one element selected from the group consisting of S, Se, and Te.) The composite nanoparticles are the so-called core-shell structure particles. Even if the core-shell structure particles are aggregated, cores are separated from each other by shell, and the cores themselves are not aggregated. Thus, the tellurium compound nanoparticles serving as the cores can sufficiently exhibit their function (e.g., a wavelength conversion function). In the core-shell structure nanoparticles, defective surface sites are covered by the coating layer, which tends to strengthen the band-edge emission.

Examples of a compound forming the coating layer include ZnS, CdS, ZnSe, CdSe, CdTe, ZnTe, and cadmium zinc telluride. It is generally effective to create an energy barrier by using a semiconductor having a composition with a larger bandgap than that of a semiconductor nanoparticle to form the coating layer. Among these compounds, ZnS is preferably used because it is less toxic than a compound containing Cd and has been actually used in a coating layer for nanoparticles. A plurality of the coating layers may be formed, that is, the coating layer may have a multi-layered structure, on the surface of the semiconductor nanoparticles. In this case, the compound for forming each layer of the multi-layered structure is preferably selected such that especially a refractive index of a lower part (part closer to the core) of the multi-layered structure is higher than that of an upper part (part closer to the surface of the composite nanoparticles) of the multi-layered structure. The outermost part of the coating layer may be further coated with a metal compound to protect the semiconductor nanoparticles from the surrounding environment.

The tellurium compound composite nanoparticles are covered with the coating layer and thus become considerably larger as a whole than the tellurium compound nanoparticles. As long as the core part of the composite nanoparticles contributing to the light emission has the shape and size defined as above, the composite nanoparticles also produce the band-edge emission. The average particle size of the composite nanoparticles is preferably 100 nm or less. When the average particle size exceeds 100 nm, the dispersion stability into the organic solvent deteriorates.

Here, the particle size means the longest one of line segments connecting any two points at the outer periphery of a single particle observed on its TEM image and passing through the center of the particle. However, when the particle has the rod shape (having a ratio of the long axis to the short axis of more than 1.2), the length of the short axis is defined as the particle size. As mentioned above in connection with the way to determine the average short-axis length, the average particle size is determined as the arithmetic average of particle sizes of the measurable particles on one TEM image. When the number of measurable particles in total is less than 100 on one TEM image, the site for imaging is changed, and particle sizes of the 100 or more particles are measured to average the measured particle sizes.

(Production Method for Tellurium Compound Nanoparticles)

As a third embodiment, a method for producing the tellurium compound nanoparticles of the first embodiment will be described below. First, a description will be made of the production method for the tellurium compound nanoparticles that is represented by the general formula: $(M^1M^2)_xM^3_y\text{Te}_2$ where y is zero, or for the tellurium compound nanoparticles that is not represented by the above-mentioned general formula and contains the elements $M^1$, $M^2$ and Te but do not contain the element $M^3$. The production method for such tellurium compound nanoparticles includes:

(a) heat-treating a mixed liquid, containing trialkylphosphine with Te powder added thereto, at 200° C. to 250° C. to thereby produce a transmissive solution which contains a Te-phosphine complex;

(b) adding a $M^1$ salt (where $M^1$ is at least one element selected from Cu, Ag, and Au) and a $M^2$ salt (where $M^2$ is at least one element selected from B, Al, Ga, and In) to a hydrocarbon-based thiol to thereby produce a solution; and (c) adding the solution obtained in the (a) heat-treating to the solution obtained in the step (b), and then heating a mixture of these solutions to 180° C. to 280° C.

In the step (a), the transmissive solution is prepared by heating, at 200° C. to 250° C., a mixed liquid obtained by adding the Te powder to trialkylphosphine, for the purpose of making the subsequent reaction proceed smoothly. That is, if the Te powder itself is used without any heat treatment, the Te powder exists in the solvent non-uniformly and thus is less likely to react with the $M^1$ salt and the $M^2$ salt in the step (c). On the other hand, when using the transmissive solution prepared in the step (a), the Te-phosphine complexes uniformly present in the transmissive solution are more likely to react with the $M^1$ salt and the $M^2$ salt. Three alkyl groups of the trialkyl phosphine used in the step (a) may be the same; two of them may be the same and the remaining one may be different; and all three alkyl groups may be different. However, the three alkyl groups are preferably the same. The alkyl groups are not specifically limited, but are preferably hydrocarbon groups having 4 to 20 carbon atoms, for example, saturated aliphatic hydrocarbon groups such as an n-butyl group, an isobutyl group, an n-pentyl group, an n-hexyl group, an n-octyle group, an n-decyl group, an n-dodecyl group, an n-hexadecyl group, and an n-octadecyl group.

The hydrocarbon-based thiol, $M^1$, and $M^2$ that are used in the step (b) have been explained above, and its description will be omitted. The $M^1$ salts and the $M^2$ salts may include, but are not limited to, an acetate, a nitrate, a sulfate, a hydrochloride, and a phosphate. The hydrocarbon-based thiol is considered to react with the $M^1$ salt and the $M^2$ salt to form a thiolate complex. The thiolate complex and the phosphine complex of Te react with each other to generate the target substance, namely, $M^1M^2Te_2$. If a hydrocarbon-based amine is used instead of the hydrocarbon-based thiol, the target substance cannot be obtained. This is because when the hydrocarbon-based amine reacts with the $M^1$ salt and the $M^2$ salt to thereby form an amine complex, the reactivity of the amine complex is so high that precipitates, such as $M^1_2Te$, are formed.

In the step (b), the solution is prepared such that a ratio of the amount of substance (moles) of the $M^1$ salt to the amount of substance (moles) of the hydrocarbon-based thiol and the amount of substance (moles) of the $M^2$ salt to the amount of substance (moles) of the hydrocarbon-based thiol are in a range of $9.0 \times 10^{-3}$ to $6.0 \times 10^{-2}$, respectively. By setting the ratio of each of the amount of the $M^1$ salt and the amount of the $M^2$ salt to the amount of the hydrocarbon-based thiol within the above-mentioned range, it becomes possible to produce the tellurium compound nanoparticles with the above-mentioned shape and size (with the rod shape and the average short-axis length of 5.5 nm or less), which are the features of this embodiment. When the ratio is too small, the average short-axis length of the particles are more likely to exceed 5.5 nm. When the ratio is too large, relatively large spherical nanoparticles are more likely to be synthesized, in addition to the rod-shaped nanoparticles, and the crystallinity of the nanoparticles is likely to be degraded. When the large spherical nanoparticles coexist in a great amount together with the rod-shaped nanoparticles, light from the rod-shaped nanoparticles and light from the spherical nanoparticles are combined to give synthesized light which is observed to have a broad peak in its emission spectrum. It is preferable that the ratio of the amount of substance (moles) of the $M^1$ salt to the amount of substance (moles) of the hydrocarbon-based thiol, and the amount of substance (moles) of the $M^2$ salt to the amount of substance (moles) of the hydrocarbon-based thiol are in a range of $1.2 \times 10^{-2}$ to $3.0 \times 10^{-2}$, respectively.

Subsequently, in the step (c), the solution obtained in the step (a) is added to the solution obtained in the step (b), and the mixture is then heated at 180° C. to 280° C., thereby producing the target tellurium compound nanoparticles. When the reaction temperature is too low, the target tellurium compound is less likely to be formed. When the reaction temperature is too high, the optical properties of the obtained tellurium compound are not improved. Thus, the reaction temperature is preferably in the above-mentioned range. There is a correlation between the reaction temperature and the crystal structure of the tellurium compound. A low-temperature range of 180° C. to 220° C. tends to give the hexagonal crystals; a middle temperature range of 220° C. to 250° C. tends to give a mixture of tetragonal crystals and hexagonal crystals in; and a high-temperature range of 250° C. to 280° C. tends to give the tetragonal crystals.

The tellurium compound nanoparticles having the hexagonal crystal structure tend to have the rod shape, and the average short-axis length of the particles tends to be 5.5 nm or less. Therefore, the heating temperature in the step (c) is preferably set in a range of 180° C. to 220° C.

After the step (c), for example, the target tellurium compound nanoparticles can be recovered from the reaction mixed liquid in the following way. The mixed liquid heated in the step (c) is allowed to cool, and alcohol is then added to the mixed liquid to form a precipitate. The precipitate is separated from the mixed liquid, and a hydrocarbon-based solvent is then added to the separated precipitate. Subsequently, coarse particles are removed, so that a solution which contains the tellurium compound nanoparticles can be obtained.

Alcohol suitable for use is lower alcohol, such as methanol, ethanol, n-propanol and so on. Hydrocarbon-based solvents suitable for use may include aromatic hydrocarbon solvents, such as benzene, toluene, and xylene and so on, and aliphatic hydrocarbon solvents, such as hexane, heptane, octane, and nonane.

In the step (b), not only the $M^1$ salt and $M^2$ salt, but also a $M^3$ salt is added when producing the $M^3$-containing tellurium compound nanoparticles represented by general formula: $(M^1M^2)_xM^3_yTe_2$, where y is not zero, or the tellurium compound nanoparticles containing the elements $M^1$, $M^2$, $M^3$ and Te, and not represented by the above general formula. The $M^3$ salts may include, but not limited to, for example, an acetate salt, a nitrate salt, a sulfate salt, a hydrochloride salt, and a phosphoric salt. When adding the $M^3$ salt, a solution is prepared such that a ratio of each of the amount of substance (moles) of the $M^1$ salt, the amount of substance (moles) of the $M^2$ salt, and the amount of substance (moles) of the $M^3$ salt to the amount of substance (moles) of the hydrocarbon-based thiol is within a range of $9.0 \times 10^{-3}$ to $6.0 \times 10^{-2}$ in the solution obtained in the step (b).

Thus, the tellurium compound nanoparticles with the shape and size characterizing this embodiment can be obtained. The ratio of the amount of substance (moles) of the $M^3$ salt to the amount of substance (moles) of the hydrocarbon-based thiol is preferably in a range of $2.1 \times 10^{-3}$ to $4.2 \times 10^{-2}$. Other steps have been described above, and thus their description will be omitted.

In producing the tellurium compound composite nanoparticles, the coating layer is formed on the tellurium compound nanoparticles obtained by the above-mentioned method. A method for forming the coating layer is disclosed in Chem, Commun. 2010, vol. 46, pp. 2082-2084. Thus, the coating layer may be formed using the method disclosed in this non-patent document. Specifically, when forming the coating layer of ZnS, for example, the tellurium compound nanoparticles are allowed to precipitate by addition of alcohol after the step (C), and then dispersed again in a hydrocarbon-based thiol (e.g., 1-dodecanethiol), to which zinc acetate is added as a zinc source. Then, thioacetamide is added thereto, and the heating is carried out, for example, at 180° C. for 30 minutes in a nitrogen atmosphere to cause a reaction therebetween. A reaction product is cooled to a room temperature, and ethanol is then added to the product, followed by centrifugal separation. The resultant precipitate is dissolved in toluene or octane, followed by centrifugal separation again to thereby remove coarse particles, thus producing a solution containing the tellurium compound composite nanoparticles. When forming the coating layer of ZnTe, instead of thioacetamide, a Te precursor prepared in the step (a) is used.

When forming the coating layer of a compound other than ZnS and ZnTe, the coating layer can also be formed in the same method as mentioned above. For example, when forming the coating layer of a Cd-containing compound, such as CdS, cadmium acetate is used as a cadmium source. When forming the coating layer of a selenium compound, Se powder is used to prepare a Se-phosphine complex solution in the same manner as that in the step (a), and the solution is used.

(Light-Emitting Device)

As a fourth embodiment, a light-emitting device will be described that uses the tellurium compound nanoparticles of the first embodiment or tellurium compound composite nanoparticles of the second embodiment.

The light-emitting device as the fourth embodiment is a light-emitting device including a light conversion member and a semiconductor light-emitting element, wherein the light conversion member contains the tellurium compound nanoparticles of the first embodiment, or the tellurium compound composite nanoparticles of the second embodiment (both types of which are hereinafter collectively referred to as "tellurium compound quantum dots"). In such a light-emitting device, for example, the tellurium compound quantum dots absorb part of the light emitted from the semiconductor light-emitting element, and then light of a longer wavelength is emitted. The light from the tellurium compound quantum dots and the remaining light emitted from the semiconductor light-emitting element are mixed together, and the mixed light can then be used as the light emission from the light-emitting device.

Specifically, the light-emitting device that emits white light can be obtained as a result by using the semiconductor light-emitting element that emits blue-violet or blue light with a peak wavelength of about 400 nm to 490 nm and the tellurium compound quantum dots that absorb blue light and then emit yellow light therefrom. Alternatively, the white light-emitting device can be obtained by using two kinds of tellurium compound quantum dots, one absorbing the blue light and emitting green light and the other tellurium compound quantum dots absorbing the blue light and emitting red light.

Further, alternatively, the white light-emitting device can be obtained by using a semiconductor light-emitting element that emits ultraviolet light with a peak wavelength of 400 nm or less, and three kinds of tellurium compound quantum dots that absorb the ultraviolet light and emit blue, green, and red lights, respectively. In this case, to avoid the leak of the ultraviolet light emitted from the light-emitting element toward the outside, the whole light from the light-emitting element is desirably absorbed and converted by the quantum dots.

Moreover, alternatively, the device emitting white light can also be obtained by using a light-emitting element that emits a blue-green light with a peak wavelength of about 490 nm to 510 nm, and tellurium compound quantum dots that absorb the blue-green light and emit red light.

Furthermore, alternatively, the light-emitting device emitting near-infrared light can also be obtained by using a semiconductor light-emitting element that emits red light with a wavelength of 700 nm to 780 nm, and tellurium compound quantum dots that absorb the red light and emit near-infrared light.

The tellurium compound quantum dots may be used in combination with other semiconductor quantum dots, or any phosphors other than quantum dots (e.g., an organic phosphor or an inorganic phosphor). Other semiconductor quantum dots may be, for example, binary semiconductor quantum dots mentioned in the section of "Background of the Invention". The phosphors other than quantum dots, can be garnet-based phosphors, such as an aluminum garnet-based phosphor. The garnet phosphors include an yttrium-aluminum-garnet-based phosphor activated by cerium, and a lutetium-aluminum-garnet-based phosphor activated by cerium. As the phosphors other than quantum dots, a nitrogen-containing calcium aluminosilicate-based phosphor activated by europium and/or chromium; a silicate-based phosphor activated by europium; a nitride-based phosphor, such as a β-SiAlON-based phosphor, a CASN-based phosphor, and a SCASN-based phosphor; a rare earth nitride-based phosphor, such as $LnSi_3N_{11}$-based phosphor and a LnSiAlON-based phosphor; an oxynitride-based phosphor, such as a $BaSi_2O_2N_2$:Eu-based phosphor and $Ba_3Si_6O_{12}N_2$:Eu-based phosphor; a sulfide-based phosphor, such as a CaS-based phosphor, a $SrGa_2S_4$-based phosphor, a $SrAl_2O_4$-based phosphor, and a ZnS-based phosphor; a chlorosilicate-based phosphor; $SrLiAl_3N_4$:Eu phosphor; $SrMg_3SiN_4$:Eu phosphor; and $K_2SiF_6$:Mn phosphor as a fluoride complex phosphor activated by manganese may be used.

The light conversion member which contains the tellurium compound quantum dots in the light-emitting device may be, for example, a sheet or plate-shaped member, or a member with a three-dimensional shape. For example, the member with the three-dimensional shape is a sealing member of a surface mounted light-emitting diode with a semiconductor light-emitting element arranged at a bottom surface of a recess formed in a package. The sealing member is formed by charging resin into the recess to seal the light-emitting element.

Alternatively, another example of the light conversion member is a resin member, which is formed into a substantially uniform thickness to enclose upper surface and side surfaces of a semiconductor light-emitting element placed on a planar substrate.

Further, alternatively, suppose that a resin member which contains reflective material is filled in a circumferential area of a semiconductor light-emitting element such that an upper end of the resin member is flush with the semiconductor light-emitting element. In this case, the light conversion member as a further example is a planar-shaped resin member formed into a predetermined thickness on the upper side of the semiconductor light-emitting element and the above-mentioned resin member which contains the reflective material.

The light conversion member may be in contact with the semiconductor light-emitting element, or provided away from the semiconductor light-emitting element. Specifically, the light conversion member may be a pellet-shaped member, a sheet member, a plate-shaped member, or a rod-shaped member, which is located away from the semiconductor light-emitting element. Alternatively, the light conversion member may be a member which is provided in contact with the semiconductor light-emitting element, for example, a sealing member, a coating member (i.e., member covering the light-emitting element provided independently from the mold member), or a mold member (e.g., including a lens-shaped member).

When using two or more kinds of tellurium compound quantum dots exhibiting the light emission of different wavelengths in the light emitting device, a mixture of the two or more kinds of quantum dots may be contained in one light conversion member, or alternatively, a combination of two or more light conversion members, each of which contains only one kind of quantum dots, may be used. In this case, two or more kinds of light conversion members may be stacked to form a stacked structure, or may be arranged on the plane in a dot-like or stripe pattern.

The semiconductor light-emitting element is, for example, a LED chip. The LED chip may include a semiconductor layer made of one or more kinds of compounds selected from the group consisting of GaN, GaAs, InGaN, AlInGaP, GaP, SiC, and ZnO. The semiconductor light-emitting element that emits blue-violet light, blue light, or ultraviolet light preferably includes, as the semiconductor layer, a GaN-based compound represented by general formula: $In_XAl_YGa_{1-X-Y}N$ ($0 \leq X$, $0 \leq Y$, $X+Y<1$).

The light-emitting device of this embodiment is preferably incorporated in a liquid crystal display device as a light source. Since the band-edge emission by the tellurium compound nanoparticles has a short photoluminescence lifetime, the light-emitting device using such tellurium compound nanoparticles is suitable for use as the light source for the liquid crystal display device requiring a relatively high response speed. The tellurium compound nanoparticles of this embodiment can exhibit the emission peak with a smaller full width at half maximum as the band-edge emission. Thus, a liquid crystal display device that exhibits excellent color reproducibility can be obtained without using a dense color filter, if, in the light-emitting device, the blue semiconductor light-emitting element is adapted to produce the blue light with a peak wavelength of 420 nm to 490 nm, while the tellurium compound nanoparticles are adapted to produce the green light with a peak wavelength of 510 nm to 550 nm and preferably 530 nm to 540 nm as well as the red light with a peak wavelength of 600 nm to 680 nm and preferably 630 nm to 650 nm; or if, in the light-emitting device, the semiconductor light-emitting element is adapted to produce the ultraviolet light with a peak wavelength of 400 nm or less, while the tellurium compound nanoparticles are adapted to produce the blue light with a peak wavelength of 430 nm to 470 nm and preferably 440 nm to 460 nm, the green light with a peak wavelength of 510 nm to 550 nm and preferably 530 nm to 540 nm, and the red light with a peak wavelength of 600 nm to 680 nm and preferably 630 to 650 nm. The light-emitting device of this embodiment is used, for example, as a direct-lit backlight or an edge-lit backlight.

Alternatively, a sheet, a plate-shaped member, or a rod made of resin, glass, or the like containing the tellurium compound nanoparticles may be incorporated as a light conversion member which is independent of the light-emitting device, into a liquid crystal display device.

EXAMPLES

Example 1

(1) Synthesis of Te Precursor

First, 10.7 mmol of Te powder was put in a flask, the inside of which was set under the nitrogen atmosphere. Subsequently, 30 cm³ of n-tri-octylphosphine stored in a nitrogen atmosphere was added to the Te powder. The inside of the flask was decompressed one time, and then the mixture was heated with a mantle heater while being stirred. When the temperature of the mixture reached 80° C., nitrogen gas was recharged into the flask, and the mixed liquid was then heated to 220° C. at a rate of temperature increase of 100° C./hr. When three hours had passed since the start of heating, the solution became an orange-Colored transmissive solution. Thereafter, the solution was allowed to cool to the room temperature, whereby the color of the solution was changed to yellow. The precursor solution thus obtained was stored under the nitrogen atmosphere until it was used for experiments.

(2) Synthesis of Tellurium Compound ($AgInTe_2$) Nanoparticles

First, 0.15 mmol of each of silver acetate (AgOAc) and indium acetate ($In(OAc)_3$) was measured and introduced into a test tube, to which 3.0 cm³ of 1-dodecanethiol was added to prepare a mixed liquid. The inside of the test tube was decompressed and then the test tube was filled with nitrogen gas. Then, 0.84 cm³ of the Te precursor solution previously prepared was added to the mixed liquid while being stirred, followed by heating at 180° C. for 10 minutes, being allowed to cool to the room temperature. After adding ethanol to the obtained product, the solution was centrifugalized to collect precipitates. Octane was added to the precipitates, which were then dispersed therein. Then, the centrifugation was conducted again to thereby remove coarse particles and the like, whereby a solution containing $AgInTe_2$ nanoparticles was obtained.

In this example, both a molar ratio of silver acetate to 1-dodecanethiol, and a molar ratio of indium acetate to 1-dodecanethiol were $1.2 \times 10^{-2}$.

Example 2

A solution containing $AgInTe_2$ nanoparticles in this example was obtained in the same way as Example 1 except that the amount of each of silver acetate and indium acetate was 0.25 mmol, the amount of the Te precursor solution was 1.4 cm³, and the amount of 1-dodecanethiol was 2.0 cm³.

In this example, both a molar ratio of silver acetate to 1-dodecanethiol, and a molar ratio of indium acetate to 1-dodecanethiol were $3.0 \times 10^{-2}$.

Comparative Example 1

A solution containing $AgInTe_2$ nanoparticles in this comparative example was obtained in the same way as Example 1 except that the amount of each of silver acetate and indium acetate was 0.074 mmol, and the amount of the Te precursor solution was 0.42 cm³.

In this example, both a molar ratio of silver acetate to 1-dodecanethiol, and a molar ratio of indium acetate to 1-dodecanethiol were $6.0 \times 10^{-3}$.

(Shape and Size of Particles)

The shapes of the tellurium compound nanoparticles obtained in Examples 1 and 2 and Comparative Example 1 were observed by using a transmission electron microscope (TEM, manufactured by HITACHI HIGH-TECHNOLOGIES Corporation, Trade name: H-7650), and their sizes were measured from TEM images at a magnification of 68000×. Here, a commercially-available copper grid with an elastic carbon supporting film (provided by OKENSHOJI Co., Ltd.) was used as a TEM grid. An average short-axis length of the tellurium compound nanoparticles and an average long-axis length thereof were measured in the following way.

1) Regarding all measurable nanoparticles included in the TEM image, that is, all nanoparticles except for nanoparticles whose parts were cut at the side edges of the image, the length of the short axis of each of these nanoparticles and the length of the long axis thereof were measured.

2) The particles having a ratio of the length of the long axis to that of the short axis of more than 1.2 (that is, rod-shaped particles) were all selected, followed by calculating an arithmetic average of each of the length of the short axis and the length of the long axis of the particles to thereby determine the average short-axis length of the particles and the average long-axis length thereof.

3) If the number of rod-shaped nanoparticles contained in one TEM image does not reach 100, another TEM image was taken and observed. Then, the lengths of the short axis and the long axis of each of the nanoparticles contained in the other TEM image were measured by the methods 1) and 2), and then the rod-shaped particles were selected. In this way, the arithmetic average of such lengths of 100 or more particles were determined.

Figure 5:
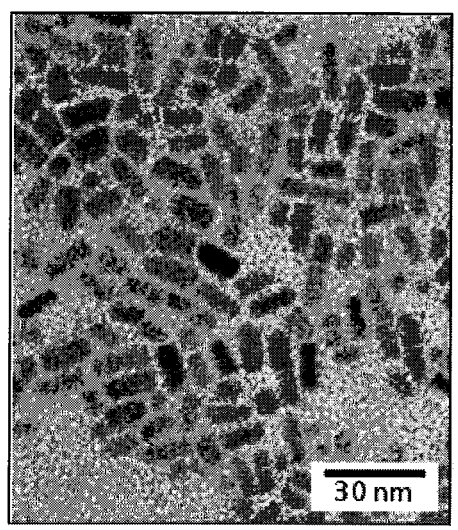
FIG. 5 shows a transmission electron microscopy (TEM) image of the tellurium compound nanoparticles synthesized in Example 1.

The results are shown in Table 1. FIG. 5 shows a transmission electron microscopy (TEM) image of tellurium compound nanoparticles obtained in Example 1.

TABLE 1

|  | Shape | Average short-axis length | Average long-axis length | Average long-axis length/Average short-axis length |
|---|---|---|---|---|
| Example 1 | Rod shape | 5.1 nm | 12.7 nm | 2.5 |
| Example 2 | Rod shape | 5.0 nm | 14.5 nm | 2.9 |
| Comparative Example 1 | Rod shape | 5.6 nm | 11.4 nm | 2.1 |

(Crystal Structure)

XRD patterns of the tellurium compound nanoparticles obtained in Examples 1 and 2 and Comparative Example 1 were measured and compared with those of chalcopyrite-type $AgInTe_2$ and wurtzite-type $AgInTe_2$. The chalcopyrite-type $AgInTe_2$ has a tetragonal crystal system, and the wurtzite-type $AgInTe_2$ has a hexagonal crystal system. A diffraction pattern of the wurtzite-type $AgInTe_2$ has not been reported yet, and thus the XRD pattern was simulated from crystal structure parameters shown in Table 2 using a powder X-ray crystal structure analysis software (RIETAN-FP) and a crystal structure drawing software (VESTA). The measured XRD patterns of samples in Examples 1 and 2 and Comparative Example 1 are shown in FIG. 1. Each XRD pattern was measured using a powder X-ray diffractometer manufactured by RIGAKU Corporation (trade name: SmartLab).

It is found that the tellurium compound nanoparticles in both Examples and Comparative Example have the same pattern as that of the wurtzite-type AgInTe2 and have a hexagonal crystal system as its crystal structure.

TABLE 2

| Crystal structure parameter | | |
|---|---|---|
| Crystal system | | Hexagonal system |
| Space group | | P6₃mc (No. 186) |
| Occupancy | Ag | 0.5 |
|  | In | 0.5 |
|  | Te | 1 |
| Atomic coordinate | Ag | x = 0.3333, y = 0.6667, z = 0.3752 |
|  | In | x = 0.3333, y = 0.6667, z = 0.3752 |
|  | Te | x = 0.3333, y = 0.6667, z = 0 |
| Lattice constant/Å | a, b | 4.521 |
|  | c | 7.449 |

(Composition Analysis)

The compositions of the tellurium compound nanoparticles in Examples 1 and 2 and Comparative Example 1 were analyzed using EDX (manufactured by HORIBA, ltd., trade name: EMAX Energy EX-250). When written to one significant figure in each example, the composition of the tellurium compound was determined to have Ag:In:Te=1:1:2, which was the stoichiometric composition of $AgInTe_2$.

(Absorption Spectrum and Emission Spectrum)

Figure 3:
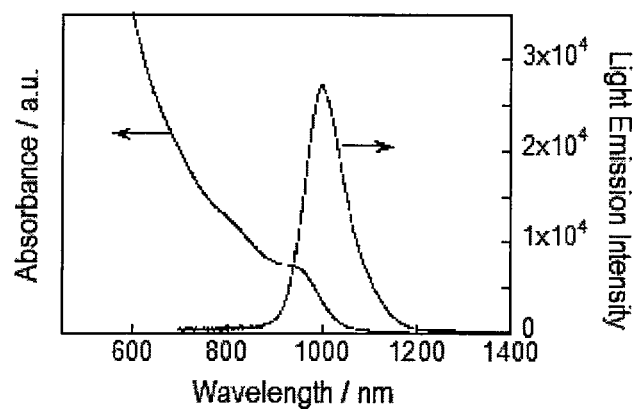
FIG. 3 shows an absorption spectrum and an emission spectrum of the tellurium compound nanoparticles synthesized in Example 2.
Figure 4:
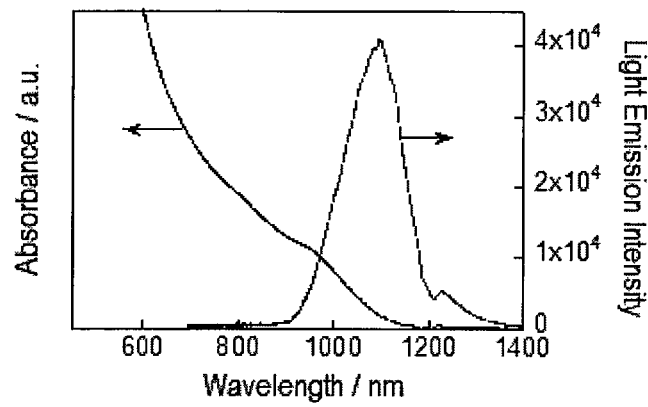
FIG. 4 shows an absorption spectrum and an emission spectrum of the tellurium compound nanoparticles synthesized in Comparative Example 1.

The tellurium compound nanoparticles obtained in Examples 1 and 2 and Comparative Example 1 were dispersed in octane, and the absorption spectrum and emission spectrum of the nanoparticles in each example were measured. The absorption spectrum was measured at wavelengths of 450 nm to 1400 nm by using an ultraviolet and visible spectrophotometer (trade name: V670) manufactured by JASCO Corporation. The emission spectrum was measured at an excitation wavelength of 700 nm by using a high-speed near-infrared spectrofluorometer (trade name: Nanolog) manufactured by HORIBA, Ltd. The results are shown in FIGS. 2 to 4. In the absorption spectra of Examples 1 and 2, the exciton peak was observed to clearly appear at about 960 nm. In the absorption spectrum of Comparative Example 1, no exciton peak was observed. In the emission spectra of Examples 1 and 2, the emission peak was observed at about 1,000 nm, while in the emission spectrum of Comparative Example 1, the emission peak was observed at about 1100 nm.

(Photoluminescence Lifetime)

The photoluminescence lifetimes of photoluminescence emitted from the tellurium compound nanoparticles obtained in Examples 1 and 2 and Comparative Example 1 were measured. The photoluminescence lifetime was measured by irradiating the respective tellurium compound nanoparticles with light at a wavelength of 635 nm as the excitation light to obtain the photoluminescence emission with use of a spectrofluorometer (trade name: Fluorolog-3) manufactured by HORIBA, Ltd. In Examples 1 and 2, decay curves of photoluminescences at wavelengths near the peak wavelengths (Example 1: 1015 nm, Example 2: 1,000 nm) of the emission spectra were determined. In Comparative Example 1, a decay curve of photoluminescence at a wavelength of 1050 nm was determined. Then, the obtained decay curve in each example was subjected to parameter fitting by using an analysis software DAS6 manufactured by HORIBA, Ltd. to determine three components in each of Examples 1 and 2. Since Comparative Example 1 had data including only two main components, the forced application of the fitting to three components in Comparative Example 1 might lead to errors. For this reason, regarding the data in Comparative Example 1, the parameter fitting was performed for the two components. As a result, τ1, τ2, and τ3, and contribution rates of respective components ($A_1$, $A_2$, and $A_3$) were determined as shown in Table 3 below.

TABLE 3

| Component | Example 1 τ₁ (ns) | Example 1 A₁ (%) | Example 2 τ₂ (ns) | Example 2 A₂ (%) | Comparative Example 1 τ₃ (ns) | Comparative Example 1 A₃ (%) |
|---|---|---|---|---|---|---|
| 1 | 9.9 | 13.36 | 10.02 | 11.4 | — | — |
| 2 | 54.84 | 49.85 | 60.55 | 52.39 | 35.36 | 34.39 |
| 3 | 158.7 | 36.79 | 165.9 | 36.21 | 178.2 | 65.61 |

In each of Examples 1 and 2, the photoluminescence lifetime (i) of the component having the highest contribution rate was 150 nm or less, more specifically, approximately 55 ns (Example 1), and approximately 61 ns (Example 2). This photoluminescence lifetime was at the substantially same level as a photoluminescence lifetime (30 ns to 60 ns) of a component having the highest contribution rate of the photoluminescence emitted from CdSe, in which band-edge emission was confirmed. In Comparative Example 1, the photoluminescence lifetime of the component having the highest contribution rate exceeded 150 ns.

The embodiments of the present disclosure provide the tellurium compound nanoparticles that enable the band-edge emission and are usable as wavelength conversion materials of light-emitting devices or biomolecule markers.

What is claimed is:

1. Tellurium compound nanoparticles, represented by the following general formula:

$$(M^1M^2)_xM^3_yTe_2$$

where $M^1$ is at least one element selected from the group consisting of Cu, Ag, and Au; $M^2$ includes at least one element selected from the group consisting of B, Al, Ga, and In; $M^3$ includes at least one element selected from the group consisting of Zn, Cd, and Hg; and x and y satisfy the following relationship:

$$x+y=2, \text{ and } 0 \leq y < 2, \text{ wherein}$$

a crystal structure of the tellurium compound nanoparticles is a hexagonal system,
the tellurium compound nanoparticles are of a rod shape and have an average short-axis length of 5.5 nm or less, and
when irradiated with light at a wavelength in a range of 350 nm to 1,000 nm, the tellurium compound nanoparticles emit photoluminescence having a wavelength longer than the wavelength of the irradiation light.

2. The tellurium compound nanoparticles according to claim 1, wherein a full width at half maximum of the photoluminescence is 150 nm or less.

3. The tellurium compound nanoparticles according to claim 1, wherein an absorption spectrum of the tellurium compound nanoparticles exhibit an exciton peak.

4. The tellurium compound nanoparticles according to claim 3, wherein the exciton peak is in a range of 350 nm to 1,000 nm.

5. The tellurium compound nanoparticles according to claim 1, wherein a photoluminescence lifetime of the component having a highest contribution rate is equal to or less than 150 ns, in which the photoluminescence lifetime of the component having the highest contribution rate is determined, on an assumption that a photoluminescence lifetime of photoluminescence at a wavelength in a range of a peak wavelength of the photoluminescence ±50 nm includes three components, by parameter fitting of a decay curve of the photoluminescence lifetime of photoluminescence.

6. The tellurium compound nanoparticles according to a claim 1, wherein a ratio (A) of an average long-axis length of the particles to an average short-axis length of the particles is in a range of $1.2 < A \leq 20$.

7. The tellurium compound nanoparticles according to claim 1, wherein $M^1$ is Ag, and $M^2$ is In.

8. The tellurium compound nanoparticles according to claim 1, wherein x is 2.

9. The tellurium compound nanoparticles according to claim 1 wherein $M^3$ is Zn.

10. The tellurium compound nanoparticles according to claim 1 wherein, in the general formula, part of the element $M^2$ is substituted by at least one element selected from the group consisting of Cr, Fe, Al, Y, Sc, La, V, Mn, Co, Ni, Ga, In, Rh, Ru, Mo, Nb, W, Bi, As, and Sb.

11. The tellurium compound nanoparticles according to claim 1, wherein, in the general formula, part of the element $M^3$ is substituted by at least one element selected from the group consisting of Co, Ni, Pd, Sr, Ba, Fe, Cr, Mn, Cu, Cd, Rh, W, Ru, Pb, Sn, Mg, and Ca.

12. The tellurium compound nanoparticles according to claim 1, wherein, in the general formula, part of Te is substituted by at least one element selected from the group consisting of S and Se.

13. The tellurium compound nanoparticles according to claim 1, wherein the tellurium compound nanoparticles have surfaces modified by a hydrocarbon-based thiol.

14. Tellurium compound composite nanoparticles, comprising:
the tellurium compound nanoparticles according to claim 1; and
one or more coating layers formed on a surface of the tellurium compound nanoparticles, the coating layer being represented by a general formula: C'Z' where C' is at least one element selected from the group consisting of Zn and Cd, and Z' is at least one element selected from the group consisting of S, Se, and Te.

15. The tellurium compound composite nanoparticles according to claim 14, wherein the tellurium compound composite nanoparticles have an average particle size of 100 nm or less.

16. A method for producing tellurium compound nanoparticles, which comprises:
(a) heat-treating a mixed liquid which contains trialkylphosphine with Te powder added thereto at 200° C. to 250° C. to thereby produce a solution which contains a Te-phosphine complex;
(b) adding an $M^1$ salt, wherein $M^1$ is at least one element selected from the group consisting of Cu, Ag, and Au, an $M^2$ salt, wherein $M^2$ includes at least one element selected from the group consisting of B, Al, Ga, and In, and optionally an $M^3$ salt, wherein $M^3$ includes at least one element selected from the group consisting of Zn, Cd, and Hg to a hydrocarbon-based thiol to thereby produce a solution; and
(c) adding the solution obtained in the (a) heat-treating to the solution obtained in step (b) and then heating a mixture of the solutions to a temperature in a range of 180° C. to 280° C.,
wherein, in the solution obtained in step (b), a ratio of each of an amount of substance of the $M^1$ salt and an amount of substance of the $M^2$ salt to an amount of substance of the hydrocarbon-based thiol is in a range of $9.0 \times 10^{-3}$ to $6.0 \times 10^{-2}$ moles, and wherein the tellurium compound nanoparticles are represented by the following general formula:

$$(M^1M^2)_xM^3_yTe_2$$

where $M^1$ is at least one element selected from the group consisting of Cu, Ag, and Au; $M^2$ includes at least one element selected from the group consisting of B, Al, Ga, and In; $M^3$ includes at least one element selected from the group consisting of Zn, Cd, and Hg; and x and y satisfy the following relationship:

$$x+y=2, \text{ and } 0 \leq y < 2.$$

17. The method for producing tellurium compound nanoparticles according to claim 16, wherein,
in the solution obtained in step (b), a ratio of each of an amount of substance of the $M^1$ salt, an amount of substance of the $M^2$ salt, and an amount of substance of the $M^3$ salt to an amount of substance of the hydrocarbon-based thiol is in a range of $9.0 \times 10^{-3}$ to $6.0 \times 10^{-2}$ moles.

18. A light-emitting device comprising a light conversion member; and a semiconductor light-emitting element, wherein the light conversion member comprises the tellurium compound nanoparticles according to claim 1.

19. The light-emitting device according to claim 18, wherein the semiconductor light-emitting element is a LED chip.

20. A liquid crystal display device comprising the light-emitting device according to claim 18 as a light source.

21. A light-emitting device comprising a light conversion member; and a semiconductor light-emitting element, wherein the light conversion member comprises the tellurium compound composite nanoparticle according to claim 14.

22. The light-emitting device according to claim 21, wherein the semiconductor light-emitting element is a LED chip.

23. A liquid crystal display device comprising the light-emitting device according to claim 21 as a light source.

* * * * *